United States Patent
Kataishi et al.

(10) Patent No.: US 12,152,147 B2
(45) Date of Patent: Nov. 26, 2024

(54) THERMALLY CONDUCTIVE SILICONE GEL COMPOSITION

(71) Applicant: Fuji Polymer Industries Co., Ltd., Nagoya (JP)

(72) Inventors: Takumi Kataishi, Aichi (JP); Yuko Kimura, Aichi (JP); Mai Sugie, Aichi (JP); Makoto Iwai, Aichi (JP); Setsuo Kikuchi, Aichi (JP)

(73) Assignee: Fuji Polymer Industries Co., Ltd., Aichi (JP)

( * ) Notice: Subject to any disclaimer, the term of this patent is extended or adjusted under 35 U.S.C. 154(b) by 672 days.

(21) Appl. No.: 17/425,888

(22) PCT Filed: Aug. 6, 2020

(86) PCT No.: PCT/JP2020/030172
§ 371 (c)(1),
(2) Date: Jul. 26, 2021

(87) PCT Pub. No.: WO2021/140694
PCT Pub. Date: Jul. 15, 2021

(65) Prior Publication Data
US 2022/0169857 A1 Jun. 2, 2022

(30) Foreign Application Priority Data
Jan. 6, 2020 (JP) ................. 2020-000447

(51) Int. Cl.
| | | |
|---|---|---|
| C08L 83/04 | (2006.01) | |
| C08K 3/013 | (2018.01) | |
| C08L 83/06 | (2006.01) | |
| H01L 23/373 | (2006.01) | |
| C08G 77/12 | (2006.01) | |
| C08G 77/20 | (2006.01) | |
| C08K 3/22 | (2006.01) | |
| C08K 3/28 | (2006.01) | |

(52) U.S. Cl.
CPC ............. *C08L 83/04* (2013.01); *C08K 3/013* (2018.01); *C08L 83/06* (2013.01); *C08G 77/12* (2013.01); *C08G 77/20* (2013.01); *C08K 2003/2227* (2013.01); *C08K 2003/2296* (2013.01); *C08K 2003/282* (2013.01); *C08L 2203/20* (2013.01); *C08L 2314/08* (2013.01); *H01L 23/3737* (2013.01)

(58) Field of Classification Search
CPC ...... C08K 3/22; C08K 3/28; C08K 2003/282; C08K 2003/2217; C08K 2003/2296; C08K 2003/2227
See application file for complete search history.

(56) References Cited

U.S. PATENT DOCUMENTS

| | | | | |
|---|---|---|---|---|
| 4,604,424 A | * | 8/1986 | Cole | .............. C08K 3/22 528/31 |
| 5,276,087 A | | 1/1994 | Fujiki et al. | |
| 2010/0220446 A1 | | 9/2010 | Tabei et al. | |
| 2016/0197025 A1 | * | 7/2016 | Bhagwagar | ............ C09J 183/04 438/118 |
| 2019/0359872 A1 | | 11/2019 | Yoo et al. | |
| 2020/0347229 A1 | | 11/2020 | Fujisawa et al. | |
| 2021/0147738 A1 | | 5/2021 | Takanashi et al. | |

FOREIGN PATENT DOCUMENTS

| | | | | |
|---|---|---|---|---|
| JP | 5-105814 | | 4/1993 | |
| JP | 2000-204259 | | 7/2000 | |
| JP | 2008-160126 | | 7/2008 | |
| JP | 2008-184549 | | 8/2008 | |
| JP | 4993611 | | 8/2012 | |
| JP | 7053936 B1 | * | 4/2022 | |
| WO | 2018/016564 | | 1/2018 | |
| WO | 2018/043270 | | 3/2018 | |
| WO | WO-2019160886 A1 | * | 8/2019 | ............... C08K 3/22 |
| WO | 2020/075411 | | 4/2020 | |
| WO | 2020/084899 | | 4/2020 | |

OTHER PUBLICATIONS

Translation of CN 109439272 (no date).*
Office Action issued in corresponding Japanese Patent Application No. 2021-510478, May 25, 2021, 8 pages w/ translation.
International Search Report issued in International Application No. PCT/JP2020/030172, Nov. 2, 2020, 3 pages.
Extended European Search Report issued in corresponding European Patent Application No. 20911320.8, Sep. 21, 2022, 7 pages.

* cited by examiner

*Primary Examiner* — Marc S Zimmer
(74) *Attorney, Agent, or Firm* — HSML P.C.

(57) ABSTRACT

A thermally conductive silicone gel composition of the present invention includes the following A to F: (A) an organopolysiloxane having two alkenyl groups per molecule; (B) an organohydrogenpolysiloxane having two Si—H groups per molecule; (C) an organohydrogenpolysiloxane having three or more Si—H groups per molecule; (D) at least one compound selected from the group consisting of D1 and D2: (D1) an organopolysiloxane having one alkenyl group per molecule and (D2) an organohydrogenpolysiloxane having one Si—H group per molecule; (E) a platinum catalyst; and (F) a thermally conductive filler in an amount of 100 to 600 vol % with respect to 100 vol % of the total amount of the A to E. The components A to F are cured. With this configuration, the thermally conductive silicone gel composition can reduce oil bleeding, even though the composition is a gel cured product.

11 Claims, 1 Drawing Sheet

THERMALLY CONDUCTIVE SILICONE GEL COMPOSITION

TECHNICAL FIELD

The present invention relates to a thermally conductive silicone gel composition that is suitable to be interposed between a heat generating member and a heat dissipating material of electrical and electronic components or the like.

BACKGROUND ART

With the significant improvement in performance of semiconductors such as CPUs in recent years, the amount of heat generated by them has become extremely large. For this reason, heat dissipating materials are attached to electronic components that may generate heat, and a thermally conductive silicone gel is used to improve the adhesion between the heat dissipating materials and semiconductors. A conventional thermally conductive silicone gel composition can be in the form of a gel cured product by containing an alkenyl group and a Si—H group in different proportions to leave an unreacted portion. However, due to the different proportions of the alkenyl group and the Si—H group, the unreacted oil of the material remains in the gel cured product, which may lead to oil bleeding. Patent Document 1 proposes a heat dissipating member that includes an organopolysiloxane having 1 or more alkenyl groups bonded to silicon atoms per molecule, an organohydrogenpolysiloxane having 2 or more hydrogen atoms bonded to silicon atoms per molecule, a platinum-based catalyst, and a thermally conductive filler. Patent Document 2 proposes a thermally conductive silicone rubber molded product obtained by curing and molding a composition that includes the following: an organopolysiloxane having an alkenyl group per molecule; a thermally conductive filler; an organohydrogenpolysiloxane having an average of 1 or more and less than 3 hydrogen atoms bonded directly to silicon atoms per molecule, and a platinum-based curing catalyst. Patent Document 3 proposes a heat dissipating member obtained by curing an addition reaction curable silicone gel composition that includes the following: an organopolysiloxane having an average of 0.1 to 2 alkenyl groups bonded to silicon atoms per molecule; an organohydrogenpolysiloxane having 2 or more hydrogen atoms bonded to silicon atoms per molecule; a platinum-based catalyst; and a thermally conductive filler.

PRIOR ART DOCUMENTS

Patent Documents

Patent Document 1: JP 2008-184549 A
Patent Document 2: JP 2008-160126 A
Patent Document 3: JP 4993611 B2

DISCLOSURE OF INVENTION

Problem to be Solved by the Invention

However, the conventional thermally conductive silicone gel composition still often causes oil bleeding.

To solve the above conventional problems, the present invention provides a thermally conductive silicone gel composition that can reduce oil bleeding, even though the composition is a gel cured product.

Means for Solving Problem

A thermally conductive silicone gel composition of the present invention includes the following A to F:
A. an organopolysiloxane having two alkenyl groups per molecule;
B. an organohydrogenpolysiloxane having two Si—H groups per molecule;
C. an organohydrogenpolysiloxane having three or more Si—H groups per molecule;
D. at least one compound selected from the group consisting of D1 and D2:
D1. an organopolysiloxane having one alkenyl group per molecule and
D2. an organohydrogenpolysiloxane having one Si—H group per molecule;
E. a platinum catalyst; and
F. a thermally conductive filler in an amount of 100 to 600 vol % with respect to 100 vol % of a total amount of the A to E, wherein components A to F are cured.

Effects of the Invention

The thermally conductive silicone gel composition of the present invention is obtained by curing the components A to F and thus can reduce oil bleeding, even though the composition is a gel cured product.

DESCRIPTION OF THE INVENTION

Figure 1A:
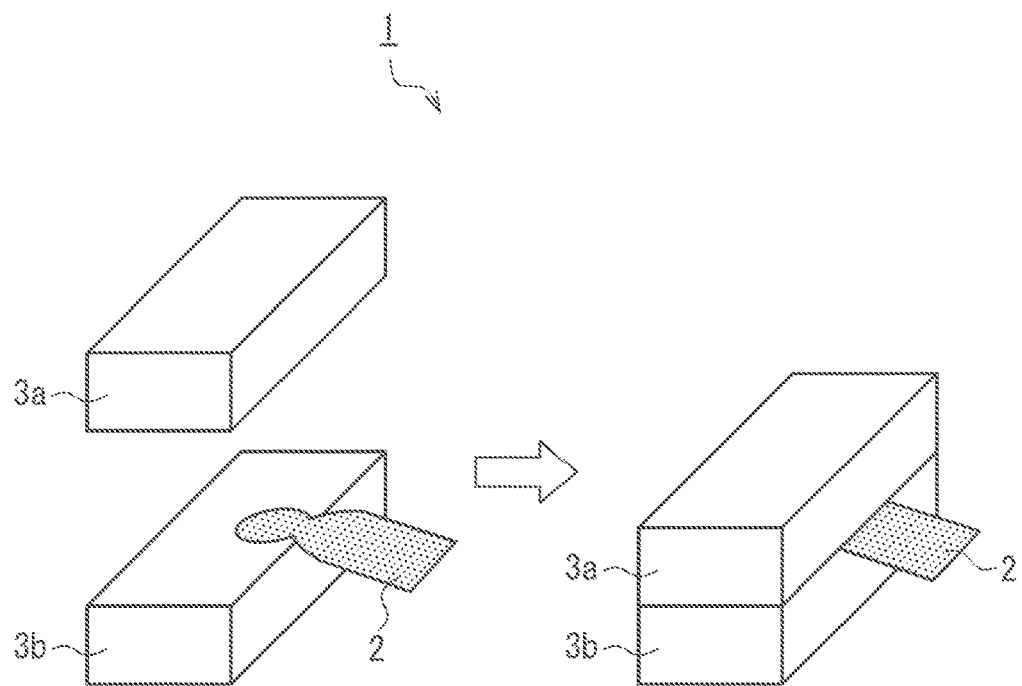
FIGS. 1A to 1B are diagrams illustrating a method for measuring a thermal conductivity of a sample in an example of the present invention.

In the present invention, at least one compound selected from an organopolysiloxane having one alkenyl group per molecule and an organohydrogenpolysiloxane having one group per molecule is used as a molecular weight modifier. The use of the molecular weight modifier allows the composition to be cured into a gel, although the unreacted alkenyl group and Si—H group are eliminated as much as possible. This also helps to reduce oil bleeding in the silicone gel cured product. Therefore, a heat dissipating silicone gel with low oil bleeding can be achieved. The occurrence of oil bleeding from the cured product may result in contamination of the surrounding members. As a result, the surrounding members may have defects. The heat dissipating silicone gel can solve these problems because of its low oil bleeding.

More specifically, the heat dissipating silicone gel is a thermally conductive silicone gel composition obtained by curing the following components A to F:
A. an organopolysiloxane having two alkenyl groups per molecule;
B. an organohydrogenpolysiloxane having two Si—H groups per molecule;
C. an organohydrogenpolysiloxane having three or more Si—H groups per molecule;
D. at least one compound selected from the group consisting of D1 and D2:
D1. an organopolysiloxane having one alkenyl group per molecule and
D2. an organohydrogenpolysiloxane having one Si—H group per molecule;
E. a platinum catalyst; and F. a thermally conductive filler in an amount of 100 to 600 vol % with respect to 100 vol % of the total amount of the A to E.

The addition of the component D can reduce the molecular weight of the silicone gel after the curing reaction. The component D has only one reactive site. If two components D react with, e.g., a polymer having two reactive groups, the molecular weight of the polymer cannot be increased further. Moreover, the component D is added to reduce the hardness of the cured product, since the cured product becomes harder as the molecular weight becomes larger. In the conventional technology, some part of the material is left unreacted so as not to increase the molecular weight. In the present invention, the molecular weight is adjusted by using the component D.

The Asker C hardness of the thermally conductive silicone gel composition of the present invention is preferably 60 or less, more preferably 40 or less, and further preferably 10 to 25. If the composition has extremely low hardness, the strength is reduced when it is used as a heat dissipating member, and the heat dissipating member is difficult to handle. If the composition has extremely high hardness, the adhesiveness is reduced when it is used as a sheet, so that heat dissipation performance is poor. Moreover, when the composition with extremely high hardness is used as a heat dissipating member, the surrounding members of the heat dissipating member may be subjected to excessive stress caused by the compression of the heat dissipating member and thus easily deformed.

The oil bleeding rate of the thermally conductive silicone gel composition is preferably 0.5 wt % or less, and more preferably 0.45 wt % or less, which is measured in such a manner that the thermally conductive silicone gel composition is formed into a molded product with a width of 25 mm, a length of 25 mm, and a thickness of 3.0 mm, and then the molded product is sandwiched between polytetrafluoroethylene (PTFE) filter papers, compressed to a thickness of 1.8 mm, and allowed to stand for 24 hours in an atmosphere of 80° C. If the oil bleeding rate is more than 0.5 wt %, oil bleeding is likely to occur from the composition in use.

The thermally conductive silicone gel composition preferably includes 1 to 300 parts by weight of the component B, 0.1 to 20 parts by weight of the component C, and 0.1 to 50 parts by weight of the component D with respect to 100 parts by weight of the component A In this case, the ratio of the Si—H group to the alkenyl group (Si—H group I alkenyl group) in all the components A to D is preferably 0.5 to 2.0, and more preferably 0.7 to 1.5. If the ratio is lower or higher than the range above, the unreacted oil of the material remains in the cured product, which may lead to oil bleeding.

Hereinafter, each component will be described.

(1) Component A

The component A of the present invention is an organopolysiloxane having two alkenyl groups per molecule and is the base resin (base polymer component) of the silicone gel composition of the present invention. In the organopolysiloxane, two alkenyl groups having 2 to 8 carbon atoms, and particularly 2 to 6 carbon atoms such as vinyl groups or allyl groups are bonded to silicon atoms per molecule. The organopolysiloxane may be linear or include a small amount of branched structure (trifunctional siloxane units) in the molecular chain. The alkenyl groups are preferably positioned at both ends of the molecular chain. The viscosity of the organopolysiloxane is preferably 10 to 100000 mm$^2$/s, and more preferably 100 to 10000 mm$^2$/s at 25° C. in terms of workability and curability. The viscosity is described in, e.g., the manufacturer's catalog and is a kinematic viscosity measured at 25° C. by an Ubbelohde viscometer.

The substituents other than the alkenyl groups in the component A are substituted or unsubstituted monovalent hydrocarbon groups that are the same as or different from each other and have no aliphatic unsaturated bond. The monovalent hydrocarbon groups have, e.g., 1 to 10 carbon atoms, and more preferably 1 to 6 carbon atoms. Specific examples of the monovalent hydrocarbon groups include the following; alkyl groups such as methyl, ethyl, propyl, isopropyl, butyl, isobutyl, tert-butyl, pentyl, neopentyl, hexyl, cyclohexyl, octyl, nonyl, and decyl groups; aryl groups such as phenyl, tolyl, xylyl, and naphthyl groups; aralkyl groups such as benzyl, phenylethyl, and phenylpropyl groups; and substituted forms of these groups in which some or all hydrogen atoms are substituted by halogen atoms (fluorine, bromine, chlorine, etc.) or cyano groups, including halogen-substituted alkyl groups such as chloromethyl, chloropropyl, bromoethyl, and trifluoropropyl groups and cyanoethyl groups.

The alkenyl groups in the component A have, e.g., 2 to 6 carbon atoms, and more preferably 2 to 3 carbon atoms. Specific examples of the alkenyl groups include vinyl, allyl, propenyl, isopropenyl, butenyl, isobutenyl, hexenyl, and cyclohexenyl groups. In particular, the vinyl group is preferred.

(2) Component B

The component B of the present invention is an organohydrogenpolysiloxane having two Si—H groups per molecule. The molecular structure of the organohydrogenpolysiloxane is preferably linear. The Si—H groups are preferably positioned at both ends of the molecular chain The number of silicon atoms in a molecule (i.e., the degree of polymerization) may be 2 to 1000, and particularly about 2 to 300.

(3) Component C

The component C of the present invention is an organohydrogenpolysiloxane having three or more Si—H groups per molecule. The molecular structure of the organohydrogenpolysiloxane may be linear or include a small amount of branched structure (trifunctional siloxane units) in the molecular chain.

The organohydrogenpolysiloxane of the component C may have the following structure.

[Chemical Formula 1]

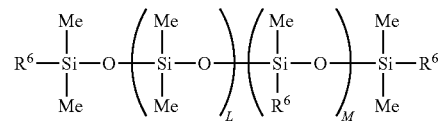

In the formula, R$^6$'s are the same as or different from each other and represent hydrogen, alkyl groups, phenyl groups, epoxy groups, acryloyl groups, methacryloyl groups, or alkoxy groups, and at least three of R$^6$'s are hydrogen. L represents an integer of 0 to 1000, and particularly 0 to 300 and M represents an integer of 1 to 200.

(4) Component D

The component D of the present invention is at least one compound selected from the following D1 and D2.

(5) Component D1

The component D1 is an organopolysiloxane having one alkenyl group per molecule. In the organopolysiloxane, one alkenyl group having 2 to 8 carbon atoms, and particularly 2 to 6 carbon atoms such as a vinyl group or an allyl group is bonded to a silicon atom per molecule as a reactive group capable of undergoing an addition reaction, and the other silicon atoms are blocked with monovalent hydrocarbon groups. The molecular structure of the organopolysiloxane may be linear or include a small amount of branched structure (trifunctional siloxane units) in the molecular chain. The viscosity of the organopolysiloxane is preferably 10 to 100000 mm$^2$/s, and more preferably 100 to 10000 mm$^2$/s at 25° C. in terms of workability and curability. The component D1 has only one reactive group and thus can reduce the molecular weight of the cured product. The use of the component D1 can provide a flexible cured product while minimizing the unreacted portion.

(6) Component D2

The component D2 is an organohydrogenpolysiloxane having one Si—H group per molecule. In the organohydrogenpolysiloxane, one Si—H group alkenyl group is present per molecule as a reactive group capable of undergoing an addition reaction, and the other silicon atoms are blocked with monovalent hydrocarbon groups. The molecular structure of the organohydrogenpolysiloxane may be linear or include a small amount of branched structure (trifunctional siloxane units) in the molecular chain. The viscosity of the organohydrogenpolysiloxane is preferably 10 to 100000 mm$^2$/s, and more preferably 100 to 10000 mm$^2$/s at 25° C. in terms of workability and curability. The component D2 has only one reactive group and thus can reduce the molecular weight of the cured product. The use of the component D2 can provide a flexible cured product while minimizing the unreacted portion.

The monovalent hydrocarbon groups in the components D1 and D2 have, e.g., 1 to 10 carbon atoms, and more preferably 1 to 6 carbon atoms. Specific examples of the monovalent hydrocarbon groups include the following; alkyl groups such as methyl, ethyl, propyl, isopropyl, butyl, isobutyl, tert-butyl, pentyl, neopentyl, hexyl, cyclohexyl, octyl, nonyl, and decyl groups; aryl groups such as phenyl, tolyl, xylyl, and naphthyl groups; aralkyl groups such as benzyl, phenylethyl, and phenylpropyl groups; and substituted forms of these groups in which some or all hydrogen atoms are substituted by halogen atoms (fluorine, bromine, chlorine, etc.) or cyano groups, inducting halogen-substituted alkyl groups such as chloromethyl, chloropropyl, bromoethyl, and trifluoropropyl groups and cyanoethyl groups.

(7) Catalyst Component (Component E)

The component E is a catalyst component that accelerates the curing of the composition. The component E may be a catalyst used for a hydrosilylation reaction. Examples of the catalyst include platinum group metal catalysts such as platinum-based, palladium-based, and rhodium-based catalysts. The platinum-based catalysts include, e.g., platinum black, platinum chloride, chloroplatinic acid, a reaction product of chloroplatinic acid and monohydric alcohol, a complex of chloroplatinic add and olefin or vinylsiloxane, and platinum bisacetoacetate. The component E may be mixed in an amount required for curing. The amount of the component E can be appropriately adjusted in accordance with the desired curing rate or the like. The component E is preferably added at a concentration of 0.01 to 1000 ppm based on the weight of metal atoms with respect to the alkenyl group containing components in the composition.

(8) The thermally conductive particles of the component F are preferably inorganic particles of e.g., alumina, zinc oxide, magnesium oxide, aluminum nitride, boron nitride, aluminum hydroxide, or silica other than hydrophilic fumed silica. These inorganic particles may be added individually or in combinations of two or more. The thermally conductive particles may have various shapes such as spherical, scaly, and polyhedral. The specific surface area of the thermally conductive particles is preferably 0.06 to 15 m$^2$/g. The specific surface area is a BET specific surface area and is measured in accordance with JIS R 1626. The average particle size of the thermally conductive particles is preferably 0.1 to 100 μm. The average particle size may be measured with a laser diffraction scattering method to determine D50 (median diameter) in a volume-based cumulative particle size distribution. The method may use, e.g., a laser diffraction/scattering particle size distribution analyzer LA-950 S2 manufactured by HORMA, Ltd.

The thermally conductive particles may include at least two types of inorganic particles with different average particle sizes. This is because small-size inorganic particles fill the spaces between large-size inorganic particles, which can provide nearly the closest packing and improve the thermal conductive properties. The at least two types of inorganic particles with different average particle sizes are preferably a combination of inorganic particles with an average particle size of 10 μm or less and inorganic particles with an average particle size of more than 10 μm.

Some or all of the thermally conductive particles of the present invention may be surface treated with a silane coupling agent. The silane coupling agent may be previously mixed with the thermally conductive particles in a pretreatment or may be added when the matrix resin is mixed with the thermally conductive particles (i.e., an integral blend method). In the integral blend method, the silane coupling agent is preferably added in an amount of 0.01 to 10 parts by weight with respect to 100 parts by weight of the thermally conductive particles. The surface treatment facilitates the impregnation of the matrix resin with the thermally conductive filler and prevents the adsorption of the platinum catalyst on the thermally conductive filler, thereby reducing curing inhibition.

The thermally conductive particles may be surface treated with a silane coupling agent such as an alkoxysilane compound expressed by $R_aSi(OR')_{4-a}$ (where R represents a substituted or unsubstituted organic group having 1 to 20 carbon atoms, preferably R represents a substituted or unsubstituted organic group having 8 to 12 carbon atoms, R' represents an alkyl group having 1 to 4 carbon atoms, and a is 0 or 1), a partial hydrolysate of the alkoxysilane compound, or an alkoxy group-containing silicone. Examples of the alkoxysilane compound (simply referred to as "silane" in the following) include the following: methyltrimethoxysilane; ethyltrimethoxysilane; propyltrimethoxysilane; butyltrimethoxysilane; pentyltrimethoxysilane; hexyltrimethoxysilane; hexyltriethoxysilane; octyltrimethoxysilane; octyltriethoxysilane; decyltrimethoxysilane; decyltriethoxysilane; dodecyltrimethoxysilane; dodecyltriethoxysilane; hexadecyltrimethoxysilane; hexadecyltriethoxysilane; octadecyltrimethoxysilane; and octadecyltriethoxysilane. These silane compounds may be used individually or in combinations of two or more. The alkoxysilane and one-end silanol siloxane may be used together as the surface treatment agent. In this case, the surface treatment may include adsorption in addition to a covalent bond.

The composition of the present invention may include components other than the above as needed. For example, a heat resistance improver, a flame retardant, and a flame retardant auxiliary such as colcothar, titanium oxide, and cerium oxide may be added. Moreover, an organic or inorganic particle pigment may be added for the purpose of coloring and toning.

EXAMPLES

Hereinafter, the present invention will be described by way of examples. However, the present invention is not limited to the following examples. Various parameters were measured in the following manner.

<Oil Bleeding Rate>

The oil bleeding rate of the thermally conductive silicone gel composition was measured in such a manner that the thermally conductive silicone gel composition was formed into a molded product with a width of 25 mm, a length of 25 mm, and a thickness of 3.0 mm, and then the molded product was sandwiched between PTFE filter papers, compressed to a thickness of 1.8 mm, and allowed to stand for 24 hours in an atmosphere of 80° C. The oil adsorbed on the PTFE filter papers was bleed oil and calculated by the following formula.

Oil bleeding rate=(weight of filter paper after test−weight of filter paper before test)/weight of silicone gel before test×100

<Hardness>

The hardness was measured by an ASKER rubber hardness tester, type C in accordance with JIS K 7312.

<Thermal Conductivity>

Figure 1B:
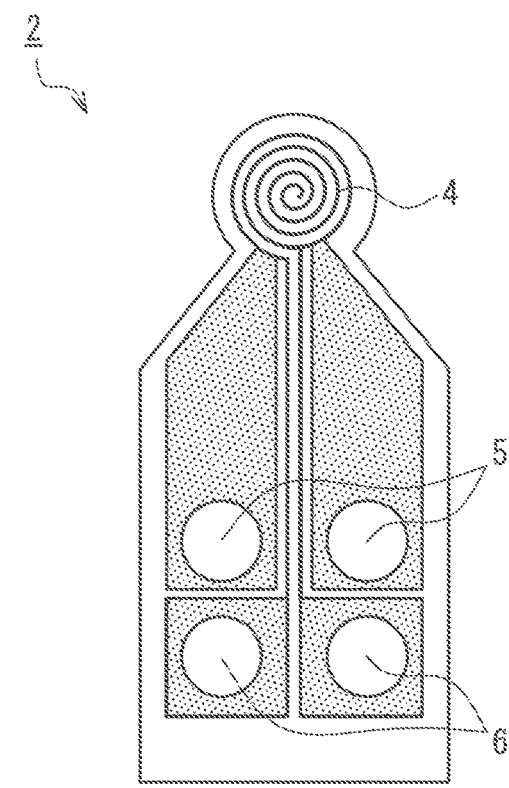

The thermal conductivity of a thermally conductive silicone gel sheet was measured by a hot disk (in accordance with ISO/CD 22007-2). As shown in FIG. 1A, using a thermal conductivity measuring apparatus 1, a polyimide film sensor 2 was sandwiched between two samples 3a, 3b, and constant power was applied to the sensor 2 to generate a certain amount of heat. Then, the thermal characteristics were analyzed from the value of a temperature rise of the sensor 2. The sensor 2 has a tip 4 with a diameter of 7 mm. As shown in FIG. 1B, the tip 4 has a double spiral structure of electrodes. Moreover, an electrode 5 for an applied current and an electrode 6 for a resistance value (temperature measurement electrode) are located on the lower portion of the sensor 2. The thermal conductivity was calculated by the following formula (1).

$$\lambda = \frac{P_0 \cdot D(\tau)}{\pi^{3/2} \cdot r} \cdot \frac{D(\tau)}{\Delta T(\tau)} \quad [\text{Formula 1}]$$

λ: Thermal conductivity (W/m·K)
$P_0$: Constant power (W)
r: Radius of sensor (m)
$\tau$: $\sqrt{\alpha \cdot t / r^2}$
α: Thermal diffusivity of sample (m²/s)
t: Measuring time (s)
D(τ): Dimensionless function of τ
ΔT(τ): Temperature rise of sensor (K)

<Viscosity>

The viscosity was described in, e.g., the manufacturer's catalog and was a kinematic viscosity measured at 25° C. by an Ubbelohde viscometer.

Examples 1 to 4 and Comparative Example 1

1. Material Components (1) The component A was an organopolysiloxane having two vinyl groups per molecule and a kinematic viscosity of 350 mm²/s: "RBL-9117" (trade name) manufactured by Dow Toray Co., Ltd.

(2) The component B was an organohydrogenpolysiloxane having two Si—H groups per molecule: "HP12" (trade name) manufactured by KCC Corporation.

(3) The component C was an organohydrogenpolysiloxane having three or more Si—H groups per molecule: "BS FLD 626V30H2.5" (trade name) manufactured by Elkem Silicones.

(4) The component D1 was an organopolysiloxane having one vinyl group per molecule and a kinematic viscosity of 100 mm²/s: "MCR-V21" (trade name) manufactured by Gelest, Inc.

(5) The component D2 was an organohydrogenpolysiloxane having one Si—H group per molecule and a kinematic viscosity of 1 mm²/s: "SIT8721.0" (trade name) manufactured by Gelest, Inc.

(6) The component E was a platinum catalyst: "SRX212" (trade name) manufactured by Dow Toray Co., Ltd.

(7) The curing retarder was ethynylcyclohexanol.

(8) The component F was a thermally conductive filler as shown in Table 1.

The alumina with an average particle size of 2.1 μm of the component F was surface treated with decyltrimethoxysilane. The amount of decyltrimethoxysilane was 1.1 parts by weight with respect to 100 parts by weight of alumina.

2. Mixing, Molding and Curing Method

The components A to F were mixed together. The mixture was sandwiched between PET films and rolled to a thickness of 3.0 mm, so that the mixture was molded into a sheet. The sheet was then cured at 100° C. for 10 minutes.

The cured sheet thus obtained was evaluated.

TABLE 1

| | | Ex. 1 | Ex. 2 | Ex. 3 | Ex. 4 | Comp. Ex. 1 |
|---|---|---|---|---|---|---|
| Component A (g) | | 67.86 | 67.86 | 68.07 | 78.06 | 92.2 |
| Component B (g) | | 6.77 | 6.77 | 6.47 | 5.85 | 5.53 |
| Component C (g) | | 0.79 | 0.79 | 0.79 | 0.49 | 2.31 |
| Component D1 (g) | | 24.59 | 24.59 | 24.66 | — | — |
| Component D2 (g) | | — | — | — | 15.61 | — |
| Component E, platinum catalyst (g) | | 0.3 | 0.3 | 0.3 | 0.3 | 0.3 |
| Curing retarder (g) | | 0.02 | 0.02 | 0.02 | 0.02 | 0.02 |
| Component F, thermally conductive filler (g) | Crushed alumina average particle size: 2.1 μm | 550 | — | — | — | — |
| | Spherical alumina average particle size: 2.0 μm | — | 150 | 20 | 150 | 150 |
| | Spherical alumina average particle size: 35 μm | — | — | — | — | — |
| | Spherical alumina average particle size: 75 μm | — | 400 | — | 400 | 400 |

TABLE 1-continued

|  | Ex. 1 | Ex. 2 | Ex. 3 | Ex. 4 | Comp. Ex. 1 |
|---|---|---|---|---|---|
| Hexagonal boron nitride average particle size: 30 μm | — | — | 100 | — | — |
| Hardness (Asker C) | 14 | 20 | 14 | 17 | 22 |
| Oil bleeding rate (wt %) | 0.22 | 0.45 | 0.44 | 0.35 | 0.99 |
| Thermal conductivity (W/m · K) | 1.4 | 1.4 | 1.4 | 1.4 | 1.4 |

The results confirmed that the thermally conductive silicone gel compositions of Examples 1 to 4 were able to reduce oil bleeding, even though they were gel cured products.

INDUSTRIAL APPLICABILITY

The thermally conductive silicone gel composition of the present invention is suitable to be interposed between a heat generating member and a heat dissipating material of electrical and electronic components or the like.

DESCRIPTION OF REFERENCE NUMERALS

1 Thermal conductivity measuring apparatus
2 Sensor
3a, 3b Sample
4 Tip of the sensor
5 Electrode for applied current
6 Electrode for resistance value (temperature measurement electrode)

The invention claimed is:

1. A thermally conductive silicone gel composition comprising the following components A to F:
   A. a linear organopolysiloxane having two alkenyl groups per molecule;
   B. a linear organohydrogenpolysiloxane having two Si—H groups per molecule, the Si—H groups being present at both ends of a molecular chain;
   C. an organohydrogenpolysiloxane having three or more Si—H groups per molecule;
   D. a linear organohydrogenpolysiloxane having one Si—H group per molecule;
   E. a platinum catalyst in an amount required for curing; and
   F. a thermally conductive filler, a volume occupied by the thermally conductive filler being 1 to 6 times a volume occupied by the components A to E,
   wherein the components A to F are cured,
   wherein the thermally conductive silicone gel composition comprises 1 to 300 parts by weight of the component B, 0.1 to 20 parts by weight of the component C, and 0.1 to 50 parts by weight of the component D with respect to 100 parts by weight of the component A, wherein a ratio of the Si—H group to the alkenyl group (Si—H group/alkenyl group) in all the components A to D is 0.5 to 2.0, and
   wherein an oil bleeding rate of the thermally conductive silicone gel composition is 0.45 wt % or less, which is calculated according to the following Formula I and measured in such a manner that the thermally conductive silicone gel composition is formed into a molded product with a width of 25 mm, a length of 25 mm, and a thickness of 3.0 mm, and then the molded product is sandwiched between polytetrafluoroethylene (PTFE) filter papers, compressed to a thickness of 1.8 mm, and allowed to stand for 24 hours in an atmosphere of 80° C., Oil bleeding rate (wt %)=[(weight of the PTFE filter papers after test−weight of the PFTE filter papers before test)/weight of the thermally conductive silicone gel composition before the test]×100 [Formula I].

2. The thermally conductive silicone gel composition according to claim 1, wherein a hardness of the thermally conductive silicone gel composition is 60 or less, which is measured by an ASKER rubber hardness tester, type C in accordance with JIS K 7312.

3. The thermally conductive silicone gel composition according to claim 1, wherein the alkenyl groups of the component A are present at both ends of an organopolysiloxane molecular chain.

4. The thermally conductive silicone gel composition according to claim 1, wherein the organopolysiloxane of the component A has a kinematic viscosity of 10 to 100000 mm²/s at 25° C.

5. The thermally conductive silicone gel composition according to claim 1, wherein a number-average degree of polymerization of the component B is 2 to 1000.

6. The thermally conductive silicone gel composition according to claim 1, wherein the organohydrogenpolysiloxane of the component C is expressed by the following chemical formula 1:

[Chemical Formula 1]

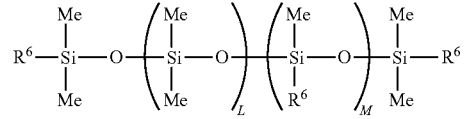

where R⁶'s are the same as or different from each other and represent hydrogen, alkyl groups, phenyl groups, epoxy groups, acryloyl groups, methacryloyl groups, or alkoxy groups, and at least three of R⁶'s are hydrogen, and
L represents an integer of 0 to 1000 and M represents an integer of 1 to 200.

7. The thermally conductive silicone gel composition according to claim 1, wherein the components D1 and D2 have a kinematic viscosity of 10 to 100000 mm²/s at 25° C.

8. The thermally conductive silicone gel composition according to claim 1, wherein thermally conductive particles of the component F are inorganic particles of at least one selected from alumina, zinc oxide, magnesium oxide, aluminum nitride, boron nitride, aluminum hydroxide, and silica other than hydrophilic fumed silica.

9. The thermally conductive silicone gel composition according to claim 1, wherein the thermally conductive particles of the component F are a combination of inorganic particles with an average particle size of 10 μm or less and inorganic particles with an average particle size of more than 10 μm.

10. The thermally conductive silicone gel composition according to claim 1, wherein the thermally conductive particles of the component F are surface treated with at least one silane coupling agent selected from an alkoxysilane compound expressed by $R_aSi(OR')_{4-a}$ (where R represents a substituted or unsubstituted organic group having 1 to 20 carbon atoms, R' represents an alkyl group having 1 to 4 carbon atoms, and a is 0 or 1), a partial hydrolysate of the alkoxysilane compound, and an alkoxy group-containing silicone.

11. The thermally conductive silicone gel composition according to claim 10, wherein the at least one silane coupling agent is added in an amount of 0.01 to 10 parts by weight with respect to 100 parts by weight of the thermally conductive particles of the component F for the surface treatment.

* * * * *